US012811530B2

(12) United States Patent
Ugare et al.

(10) Patent No.: US 12,811,530 B2
(45) Date of Patent: Nov. 24, 2026

(54) SYSTEMS FOR INVERTER HAVING POWER MODULE WITH T-TYPE ARRANGEMENT FOR ELECTRIC VEHICLE

(71) Applicant: BorgWarner US Technologies LLC, Wilmington, DE (US)

(72) Inventors: Chetan Ugare, Nuremberg (DE); Stefan Berindan, Nuremberg (DE); Andreas Apelsmeier, Pollenfeld (DE); Naga Venkata Kishore Akkala, Nuremberg (DE)

(73) Assignee: BorgWarner US Technologies LLC, Wilmington, DE (US)

( * ) Notice: Subject to any disclaimer, the term of this patent is extended or adjusted under 35 U.S.C. 154(b) by 0 days.

(21) Appl. No.: 18/812,406

(22) Filed: Aug. 22, 2024

(65) Prior Publication Data

US 2026/0058587 A1 Feb. 26, 2026

(51) Int. Cl.

| | |
|---|---|
| ***H02M 7/483*** | (2007.01) |
| ***B60L 50/51*** | (2019.01) |
| ***B60L 50/60*** | (2019.01) |
| ***H02P 25/30*** | (2006.01) |
| ***H02P 27/06*** | (2006.01) |
| ***H05K 7/20*** | (2006.01) |

(52) U.S. Cl.

CPC .............. *H02P 27/06* (2013.01); *B60L 50/51* (2019.02); *B60L 50/60* (2019.02); *H02P 25/30* (2013.01); *H05K 7/209* (2013.01); *B60L 2210/42* (2013.01)

(58) Field of Classification Search

CPC ........................................................ H02P 27/06

See application file for complete search history.

(56) References Cited

U.S. PATENT DOCUMENTS

| | | | | |
|---|---|---|---|---|
| 12,291,104 | B1 * | 5/2025 | Luo | H02M 7/003 |
| 2014/0252410 | A1 | 9/2014 | Laschek-Enders | |
| 2022/0077021 | A1 | 3/2022 | Avenas et al. | |
| 2022/0115943 | A1 * | 4/2022 | Nakamura | H02M 7/003 |

(Continued)

FOREIGN PATENT DOCUMENTS

| | | | |
|---|---|---|---|
| CN | 202586768 | U | 12/2012 |
| CN | 112701111 | A | 4/2021 |

(Continued)

OTHER PUBLICATIONS

Alizadeh Rayna et al: "RPEM: Design and Realization of Reconfigurable Power Electronic Modules", IEEE Transactions on Power Electronics, Institute of Electrical and Electronics Engineers, USA, vol. 37, No. 6, Dec. 23, 2021 (Dec. 23, 2021), pp. 6755-6764, ISSN: 0885-8993, DOI:10.1109/TPEL.2021.3137802.

(Continued)

*Primary Examiner* — Menatoallah Youssef
*Assistant Examiner* — Esayas G Yeshaw
(74) *Attorney, Agent, or Firm* — Joshua M. Haines; Bookoff McAndrews, PLLC

(57) ABSTRACT

A system including an inverter to convert DC power from a battery to AC power to drive a motor, wherein the inverter includes a first power module including a first switch electrically connected to a positive DC power tab and an AC power tab, a second switch electrically connected to a negative DC power tab and the AC power tab, and two switches electrically connected to a neutral power tab and the AC power tab.

16 Claims, 9 Drawing Sheets

(56) References Cited

U.S. PATENT DOCUMENTS

| | | | | |
|---|---|---|---|---|
| 2023/0019205 | A1* | 1/2023 | Murakami | H02M 7/5387 |
| 2024/0367529 | A1* | 11/2024 | Taskas | B60L 53/11 |
| 2025/0145009 | A1* | 5/2025 | Luo | H02M 1/0054 |

FOREIGN PATENT DOCUMENTS

| | | | |
|---|---|---|---|
| CN | 116581034 | A | 8/2023 |
| JP | 2015211524 | A | 11/2015 |

OTHER PUBLICATIONS

Chen Mengxing et al: "Switching Characterization of SiC MOSFETs in Three-Level Active Neutral-Point-Clamped Inverter Application", 2019 10th International Conference on Power Electronics and ECCE Asia (ICPE 2019—ECCE Asia), The Korean Institute of Power Electronics (KIPE), May 27, 2019 (May 27, 2019), pp. 1793-1799.

Yuan Zhao et al: "A Low Inductance, High Power Density 3L-TNPC Power Module for More-Electric Aircraft Applications", IEEE Transactions on Transportation Electrification, IEEE, vol. 8, No. 4, Jun. 14, 2022 (Jun. 14, 2022), pp. 4291-4302, DOI: 10.1109/TTE.2022.3183227.

* cited by examiner

SYSTEMS FOR INVERTER HAVING POWER MODULE WITH T-TYPE ARRANGEMENT FOR ELECTRIC VEHICLE

TECHNICAL FIELD

Various embodiments of the present disclosure relate generally to systems for an inverter having a double side cooled power module, and, more particularly, to systems for a three-level inverter having a double side cooled power module with a T-type arrangement for an electric vehicle.

BACKGROUND

Inverters, such as those used to drive a motor in an electric vehicle, for example, are responsible for converting Direct Current (DC) into Alternating Current (AC) to drive the motor. In some systems, two-level inverters have a simple structure and a relatively low cost of production. However, some two-level inverters may generate an output voltage including a high level of harmonics and a relatively low efficiency at a higher switching frequency.

The present disclosure is directed to overcoming one or more of these above-referenced challenges.

SUMMARY OF THE DISCLOSURE

In some aspects, the techniques described herein relate to a system including: an inverter to convert DC power from a battery to AC power to drive a motor, wherein the inverter includes: a first power module including: a first switch electrically connected to a positive DC power tab and an AC power tab; a second switch electrically connected to a negative DC power tab and the AC power tab; and two switches electrically connected to a neutral power tab and the AC power tab.

In some aspects, the techniques described herein relate to a system, further including: a first heat sink on a first side of the first power module; and a second heat sink on a second side of the first power module.

In some aspects, the techniques described herein relate to a system, further including a capacitor electrically connected to the first power module.

In some aspects, the techniques described herein relate to a system, further including: a second power module; and a third power module, wherein the first power module corresponds to a first phase of the motor, the second power module corresponds to a second phase of the motor, and the third power module corresponds to a third phase of the motor.

In some aspects, the techniques described herein relate to a system, further including: a first heat sink; and a second heat sink, wherein the first heat sink is on a first side surface of the first power module, on a first side surface of the second power module, and on a first side surface of the third power module, and wherein the second heat sink is on a second side surface of the first power module, on a second side surface of the second power module, and on a second side surface of the third power module.

In some aspects, the techniques described herein relate to a system, wherein the two switches include a third switch and a fourth switch arranged in series.

In some aspects, the techniques described herein relate to a system, wherein the first switch, the second switch, the third switch, and the fourth switch each include two or more semiconductor dies.

In some aspects, the techniques described herein relate to a system, wherein each of the two or more semiconductor dies in the first switch, the second switch, the third switch, and the fourth switch are arranged with symmetrical gate routing.

In some aspects, the techniques described herein relate to a system, wherein the two or more semiconductor dies in the first switch, the second switch, the third switch, and the fourth switch are arranged in a drain-down arrangement.

In some aspects, the techniques described herein relate to a system, wherein the two switches are a switch group.

In some aspects, the techniques described herein relate to a system, wherein: the two or more semiconductor dies in the second switch, the third switch, and the fourth switch are arranged in a drain-down arrangement, and the two or more semiconductor dies in the first switch are arranged in a source-down arrangement.

In some aspects, the techniques described herein relate to a system, further including: the battery configured to supply the DC power to the inverter; and the motor configured to receive the AC power from the inverter to drive the motor, wherein the system is provided as a vehicle including the inverter, the battery, and the motor.

In some aspects, the techniques described herein relate to a system including a power module for an inverter, the power module including: a first switch electrically connected to a positive DC power tab and an AC power tab; a second switch electrically connected to a negative DC power tab and the AC power tab; and two switches electrically connected to a neutral power tab and the AC power tab.

In some aspects, the techniques described herein relate to a system, wherein the two switches include a third switch and a fourth switch, and wherein the first switch, the second switch, the third switch, and the fourth switch each include one or more semiconductor dies arranged with symmetrical gate routing.

In some aspects, the techniques described herein relate to a system, wherein the one or more semiconductor dies in the first switch, the second switch, the third switch, and the fourth switch are arranged in a drain-down arrangement.

In some aspects, the techniques described herein relate to a system, wherein the power module includes one or more spacers.

In some aspects, the techniques described herein relate to a system, wherein: the one or more semiconductor dies in the second switch, the third switch, and the fourth switch are arranged in a drain-down arrangement, and the one or more semiconductor dies in the first switch are arranged in a source-down arrangement.

In some aspects, the techniques described herein relate to a system, further including a capacitor electrically connected to the power module.

In some aspects, the techniques described herein relate to a system including a power module, the power module including: a positive DC power tab; a negative DC power tab; a neutral power tab; an AC power tab; a first switch electrically connected to the positive DC power tab and the AC power tab; a second switch electrically connected to the negative DC power tab and the AC power tab; and two switches electrically connected to the neutral power tab and the AC power tab.

In some aspects, the techniques described herein relate to a system, further including: a first heat sink; and a second heat sink, wherein the two switches include a third switch and a fourth switch, wherein the first heat sink is on a first surface of the power module, and wherein the second heat sink is on a second surface of the power module.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed example embodiments.

DETAILED DESCRIPTION OF EMBODIMENTS

Figure 1:
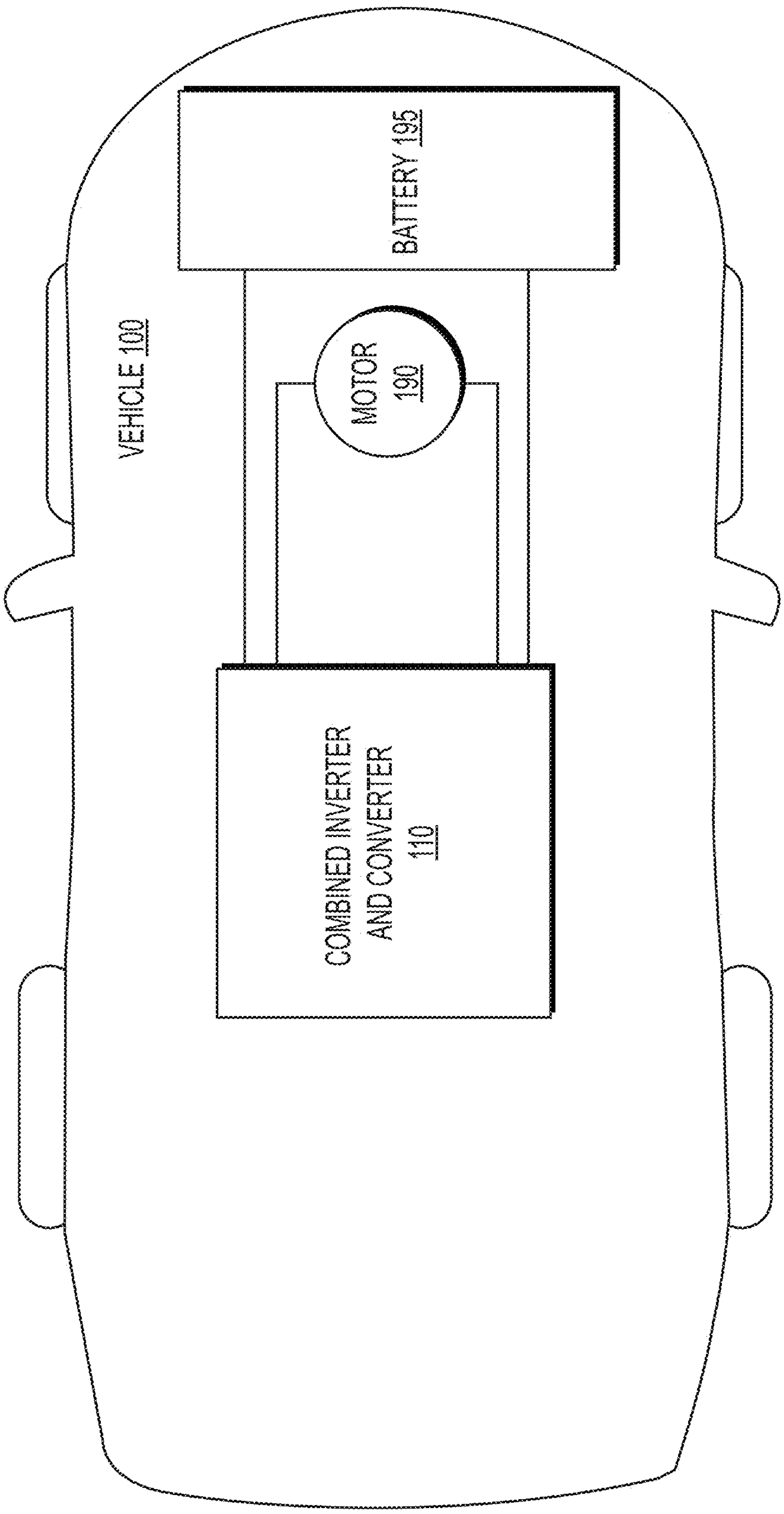
FIG. 1 depicts an exemplary system infrastructure for a vehicle including a combined inverter and converter, according to some embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of +10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to systems for an inverter having a double side cooled power module, and, more particularly, to systems for a three-level inverter having a double side cooled power module with a T-type arrangement for an electric vehicle. Inverters, such as those used to drive a motor in an electric vehicle, for example, are responsible for converting Direct Current (DC) into Alternating Current (AC) to drive the motor. A three phase inverter may include a bridge with six power device switches (for example, power transistors such as IGBT or MOSFET) that are controlled by Pulse Width Modulation (PWM) signals generated by a controller.

In some systems, two-level inverters are popular due to their low cost and simple structure. However, two-level inverters may generate an output voltage including a high level of harmonics and a relatively low efficiency at a higher switching frequency. Three-level inverter topology may address some issues of the two-level inverters, such as the high level of harmonics in output voltage and the relatively lower efficiency at higher switching frequencies. In contrast to two-level inverters, multilevel inverters, such as three-level inverters, may generate output voltage waveforms with lower harmonics to better resemble sinusoidal references. Moreover, lower dv/dt and electromagnetic interference (EMI) emissions may be achieved using multilevel topology. Accordingly, a T-type three-level inverter may be a more suitable (or beneficial) topology among the multilevel inverters due to three level output voltage capability and a lesser number of switching devices.

With the advent of electric vehicles, driving three phase motors more efficiently may be becoming increasingly important. Three phase motors may be driven with three half-H or phase switches that switch the motor phase connections between a positive high voltage direct current voltage source (HVDC+) and a negative high voltage direct current voltage source (HVDC−). The loop inductance associated with the phase switches may be important, and may be even more important as silicon carbide (SiC) devices become more prevalent. Lower loop inductance may be especially important with fast SiC devices as lower loop inductance may allow faster switching times while maintaining appropriate voltage along with appropriate current overshoots and ringing.

Some systems may include minimal or no existence of three level T-type power modules for power class 100 kW-250 kW inverters for the automotive market. Some systems may include challenges with thermal performances of three level single side cooled power modules for industrial and/or automotive applications. Some systems may include relatively large commutation loops and complex heat sink assemblies for a T-type topology with single switches. Some systems may include noise coupling to power supplies due to relatively high inductances for T-type topology built with single switches.

For example, some systems may include a stacked arrangement of power modules with single switches. A DC loop inductance measured in a loop between a positive voltage terminal (e.g., HV+) and a neutral terminal may be approximately 104.4 nH, and a DC loop inductance measured in a loop between a negative voltage terminal (e.g., HV−) and the neutral terminal may be approximately 107.7 nH. A 1 MHz loop inductance measured in the loop between the positive voltage terminal (e.g., HV+) and the neutral terminal may be approximately 56.4 nH, and a 1 MHz loop inductance measured in the loop between the negative voltage terminal (e.g., HV−) and the neutral terminal may be approximately 57.7 nH. However, this is an example, and embodiments are not limited thereto.

Some systems may include a parallel arrangement of power modules with single switches. A DC loop inductance measured in a loop between a positive voltage terminal (e.g., HV+) and a neutral terminal may be approximately 131.8 nH, and a DC loop inductance measured in a loop between a negative voltage terminal (e.g., HV−) and the neutral terminal may be approximately 132.6 nH. A 1 MHz loop inductance measured in the loop between the positive voltage terminal (e.g., HV+) and the neutral terminal may be approximately 81.9 nH, and a 1 MHz loop inductance measured in the loop between the negative voltage terminal (e.g., HV−) and the neutral terminal may be approximately 82.2 nH.

One or more embodiments may include one or more dies forming switches Q1, Q5, and Q9 electrically connected to a positive DC power terminal, one or more dies forming switches Q2, Q6, and Q10 electrically connected to a negative DC power terminal, and one or more dies forming switches Q3-Q4, Q7-Q8, and Q11-Q12 electrically connected to a neutral power terminal. One or more embodiments may include gate leads having the same geometry for all phases, which may enhance the balance of current distribution to provide better electrical behavior.

FIG. 1 depicts an exemplary system infrastructure for a vehicle including a combined inverter and converter, according to one or more embodiments. Alternatively, the inverter may be an inverter without a converter. In the context of this disclosure, the inverter without a converter, or the combined inverter and converter, may be referred to as an inverter. As shown in FIG. 1, electric vehicle 100 may include an inverter 110, a motor 190, and a battery 195. The inverter 110 may include components to receive electrical power from an external source and output electrical power to charge the battery 195 of electric vehicle 100. The inverter 110 may convert DC power from the battery 195 in electric vehicle 100 to AC power, to drive (e.g. rotate) the motor 190 of the electric vehicle 100, for example, but the embodiments are not limited thereto. The inverter 110 may be bidirectional, and may convert DC power to AC power, or convert AC power to DC power, such as during regenerative braking, for example. The inverter 110 may be a three-phase inverter, a single-phase inverter, or a multi-phase inverter.

Figure 2:
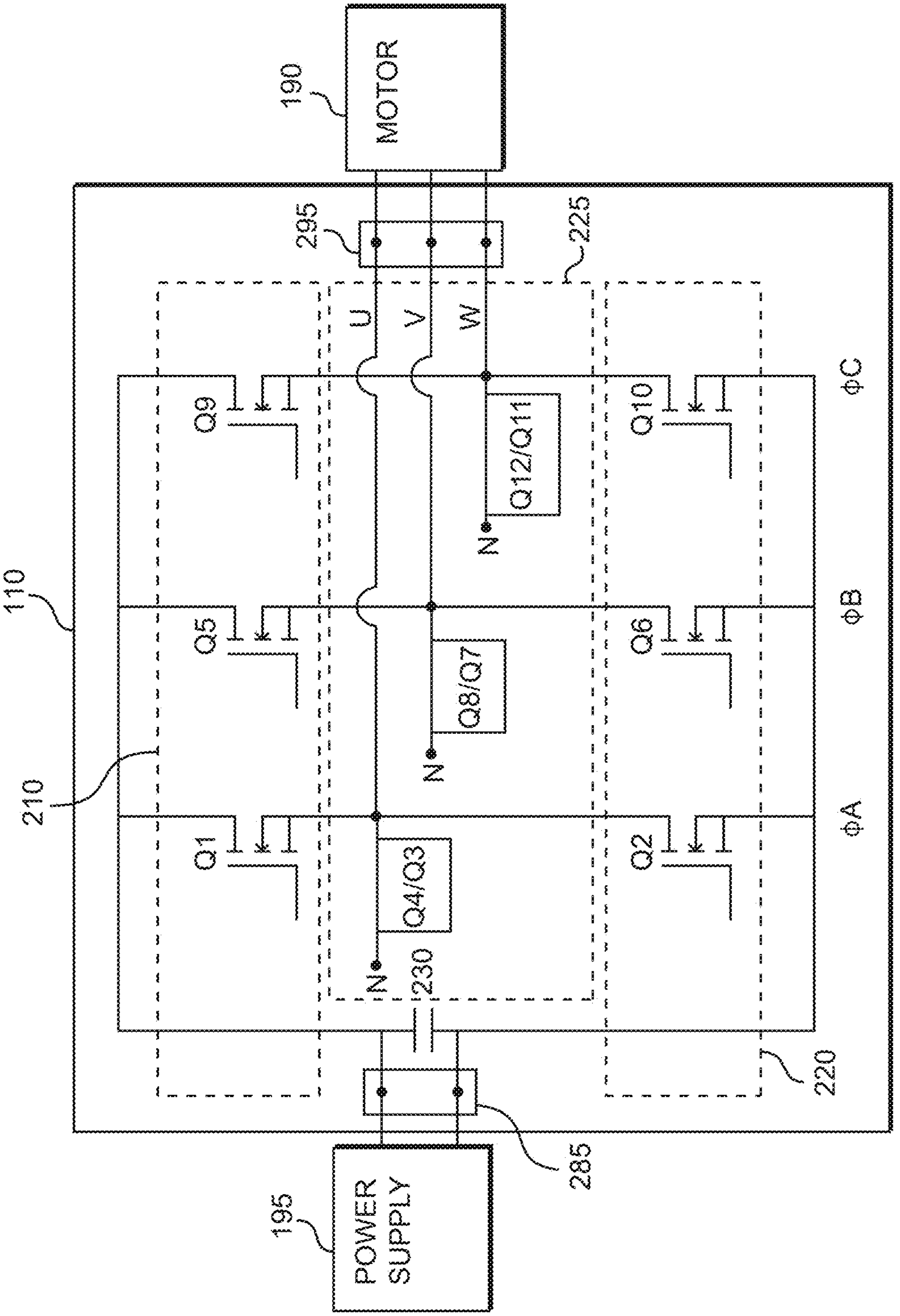
FIG. 2 depicts an electrical power schematic of a three phase inverter module, according to one or more embodiments.
Figure 4:
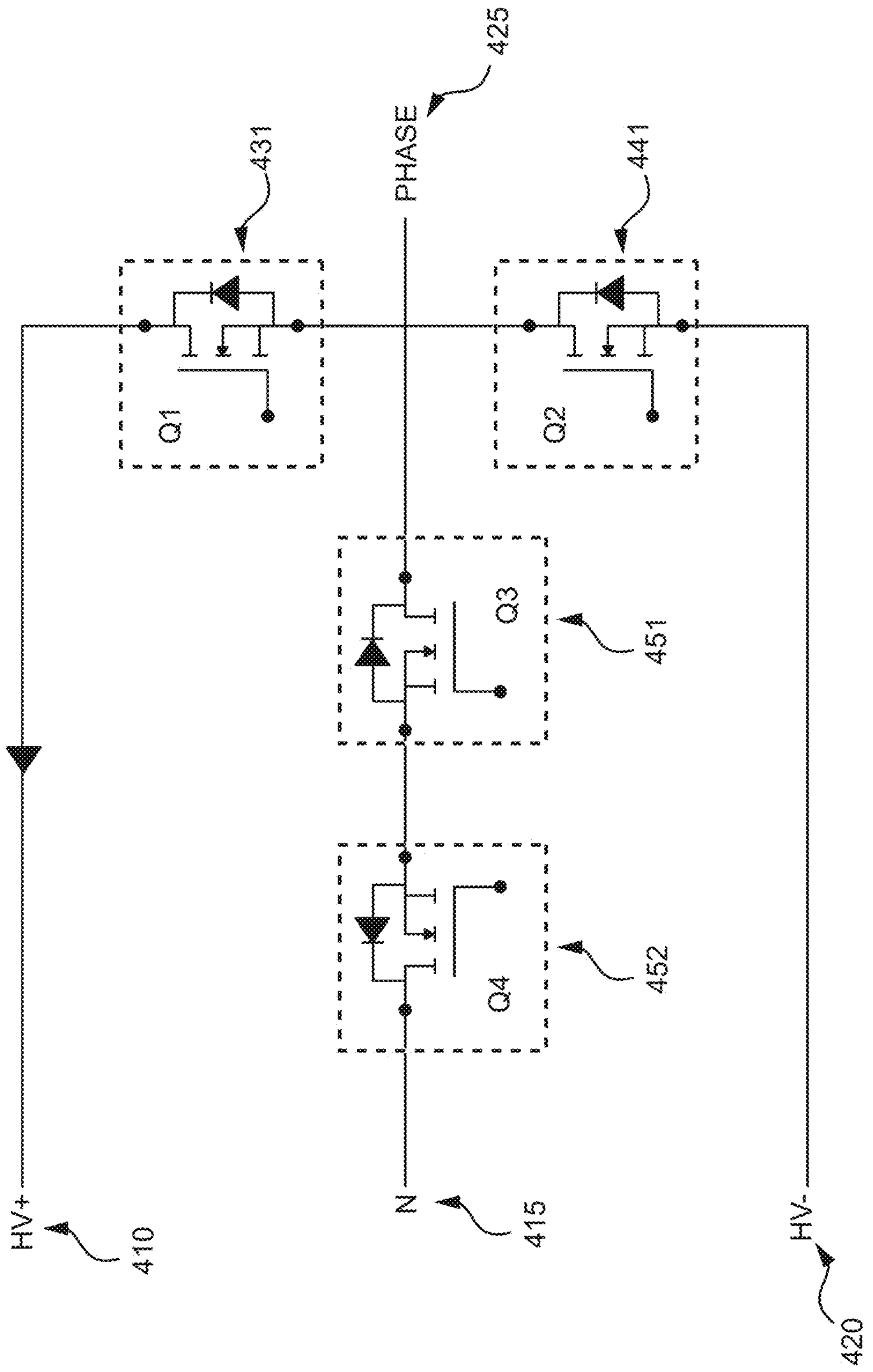
FIG. 4 depicts an electrical power schematic of a T-type three level power module, according to one or more embodiments.

FIG. 2 depicts an electrical power schematic of a three phase inverter module, according to one or more embodiments. As shown in FIGS. 1 and 2, the inverter 110 may be connected to the battery 195 and the motor 190. Battery 195 may be any power supply, and motor 190 may be any load. The inverter 110 may a include first three-phase switch group 210, a second three-phase switch group 220, and a third three-phase switch group 225. A first phase U may correlate with DA including switch Q1, switch Q2, switch Q3, switch Q4, and neutral power terminal N, a second phase V may correlate with ϕB including switch Q5, switch Q6, switch Q7, switch Q8, and neutral power terminal N, and a third phase W may correlate with ϕC including switch Q9, switch Q10, switch Q11, switch Q12, and neutral power terminal N. The first three-phase switch group 210 may include first phase switch Q1, second phase switch Q5, and third phase switch Q9. The second three-phase switch group 220 may include first phase switch Q2, second phase switch Q6, and third phase switch Q10. The third three-phase switch group 225 may include first phase switches Q3 and Q4, second phase switches Q7 and Q8, and third phase switches Q11 and Q12. The switches Q1-Q12 may be metal-oxide-semiconductor field-effect transistors (MOSFET), insulated-gate bipolar transistors (IGBTs), silicon carbide (SiC) transistors, and/or gallium nitride (GaN) transistors, for example, but embodiments are not limited thereto. The switches Q1-Q12 may each include multiple dies arranged in parallel, but embodiments are not limited thereto. Although switches are depicted as one switch in FIG. 2, each switch may be one or more switches. Switch Q3 and switch Q4, for example, may be a switch group, as depicted in FIG. 2, including two switches as depicted in FIG. 4.

The first three-phase switch group 210, the second three-phase switch group 220, and the third three-phase switch group 225 may be driven by a PWM signal generated by inverter controller 300 (shown in FIG. 3) to convert DC power delivered via input terminal set 285 at capacitor 230 to three phase AC power at outputs U, V, and W via output terminal set 295 to the motor 190. Additionally, although FIGS. 1 and 2 illustrate a three-phase inverter, the disclosure is not limited thereto, and may include single phase or multi-phase inverters.

Figure 3:
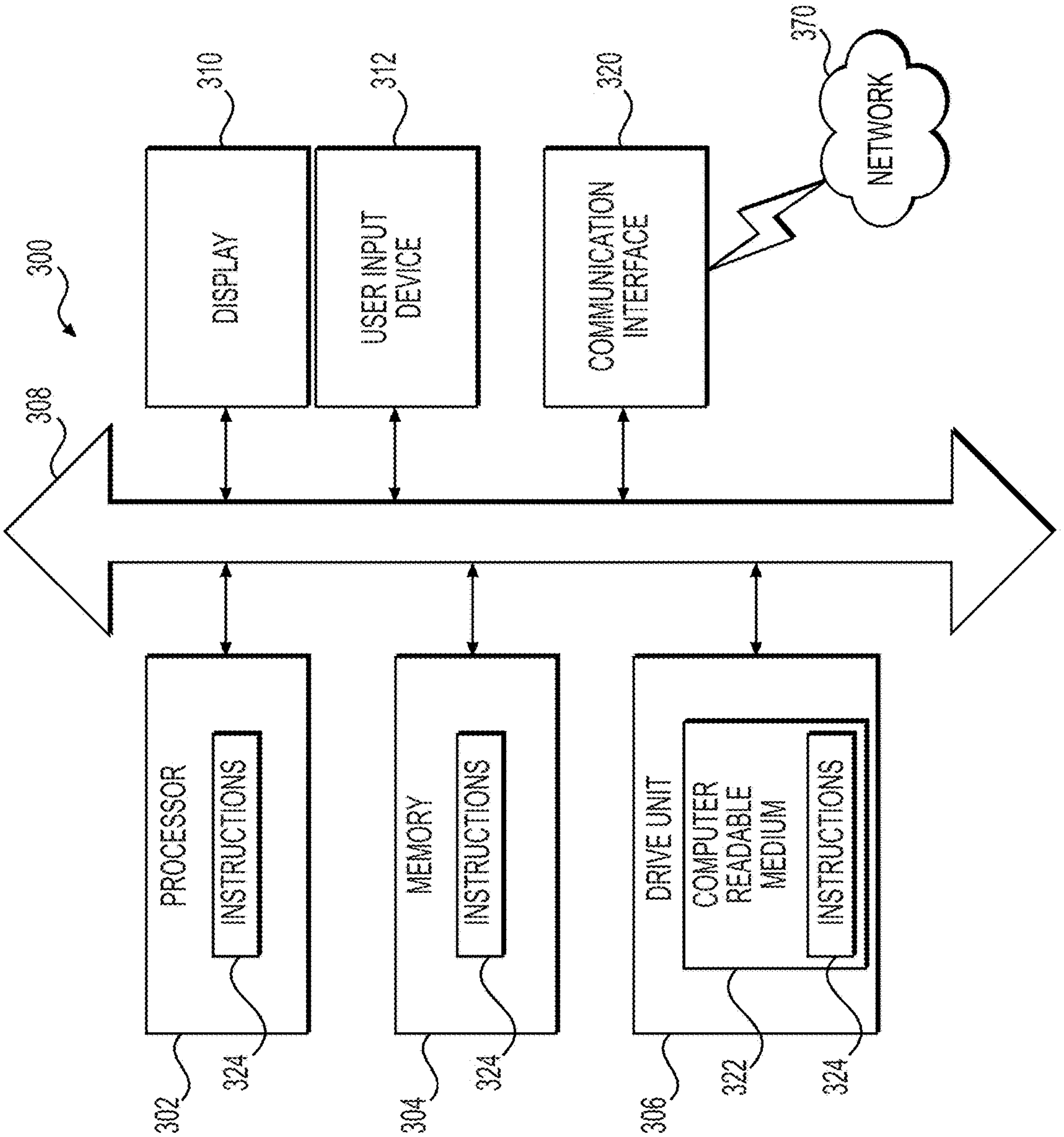
FIG. 3 depicts an exemplary system infrastructure for an inverter controller, according to one or more embodiments.

FIG. 3 depicts an exemplary system infrastructure for an inverter controller, according to one or more embodiments.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term “system” shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of the inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which instructions 324 (e.g., one or more sets of instructions), e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, the computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

FIG. 4 depicts an electrical power schematic of a T-type three level power module, according to one or more embodiments. Power module 400 may include a first switch 431, a second switch 441, a third switch 451, and a fourth switch 452. Power module 400 may include a positive DC power terminal 410, a negative DC power terminal 420, a neutral power terminal 415, and a phase terminal 425. The first switch 431 may be electrically connected to the positive DC power terminal 410 and the phase terminal 425. The second switch 441 may be electrically connected to the negative DC power terminal 420 and the phase terminal 425. The third switch 451 may be electrically connected to the fourth switch 452 and the phase terminal 425. The fourth switch 452 may be electrically connected to the neutral power terminal 415 and the third switch 451. Two switches may be arranged in series between the neutral power terminal 415 and the phase terminal 425. For example, the third switch 451 may be electrically connected (or arranged) in series with the fourth switch 452. The third switch 451 may be arranged between the phase terminal 425 and the fourth switch 452. The fourth switch 452 may be arranged between the neutral power terminal 415 and the third switch 451. The first switch 431, the second switch 441, and the third switch 451 may be electrically connected to the phase terminal 425 such that the first switch 431, the second switch 441, the third switch 451, and the fourth switch 452 are arranged in a T-type arrangement.

The first switch 431, the second switch 441, the third switch 451, and the fourth switch 452 may each include one or more semiconductor dies or two or more semiconductor dies. For example, the first switch 431, the second switch 441, the third switch 451, and the fourth switch 452 may each include one semiconductor die, two semiconductor dies, or four semiconductor dies, but embodiments are not limited thereto. The semiconductor dies may include transistors, and each transistor may include one or more metal-oxide-semiconductor field-effect transistors (MOSFET), for example, but embodiments are not limited thereto. The transistors may each include a source, a drain, and a gate. The third switch 451 may be arranged opposite to the fourth switch 452 in a common source arrangement such that the source in the transistor of the third switch 451 may be electrically connected to the source of the transistor of the fourth switch 452, for example, but embodiments are not limited thereto. For example, the third switch 451 may be arranged opposite to the fourth switch 452 in a common drain arrangement such that the drain in the transistor of the third switch 451 may be electrically connected to the drain of the transistor of the fourth switch 452. The first switch 431 may be arranged in a same direction as the second switch 441, for example, but embodiments are not limited thereto.

The power module 400 may be configured to operate such that when a current flows in a loop between the neutral power terminal 415 and the positive DC power terminal 410, the third switch 451 is in an ON state (or activated) and the second switch 441 is in an OFF state (or not activated), while the first switch 431 and the fourth switch 452 are switching alternating between the ON state and the OFF state, but embodiments are not limited thereto.

The power module 400 may be configured to operate such that when a current flows in a loop between the negative DC power terminal 420 and the neutral power terminal 415, the fourth switch is in an ON state (or activated) and the first switch 431 is in an OFF state (or not activated), while the second switch 441 and the third switch 451 are switching alternating between the ON state and the OFF state, but embodiments are not limited thereto.

With reference to FIG. 2, the first switch 431 may correlate with any one of the switch Q1, the switch Q5, and the switch Q9; the second switch 441 may correlate with any one of the switch Q2, the switch Q6, and the switch Q10; the third switch 451 may correlate with any one of the switch Q3, the switch Q7, and the switch Q11; the fourth switch 452 may correlate with any one of the switch Q4, the switch Q8, and the switch Q12, and the neutral power terminal 415 may correlate with the neutral power terminal N.

Figure 5:
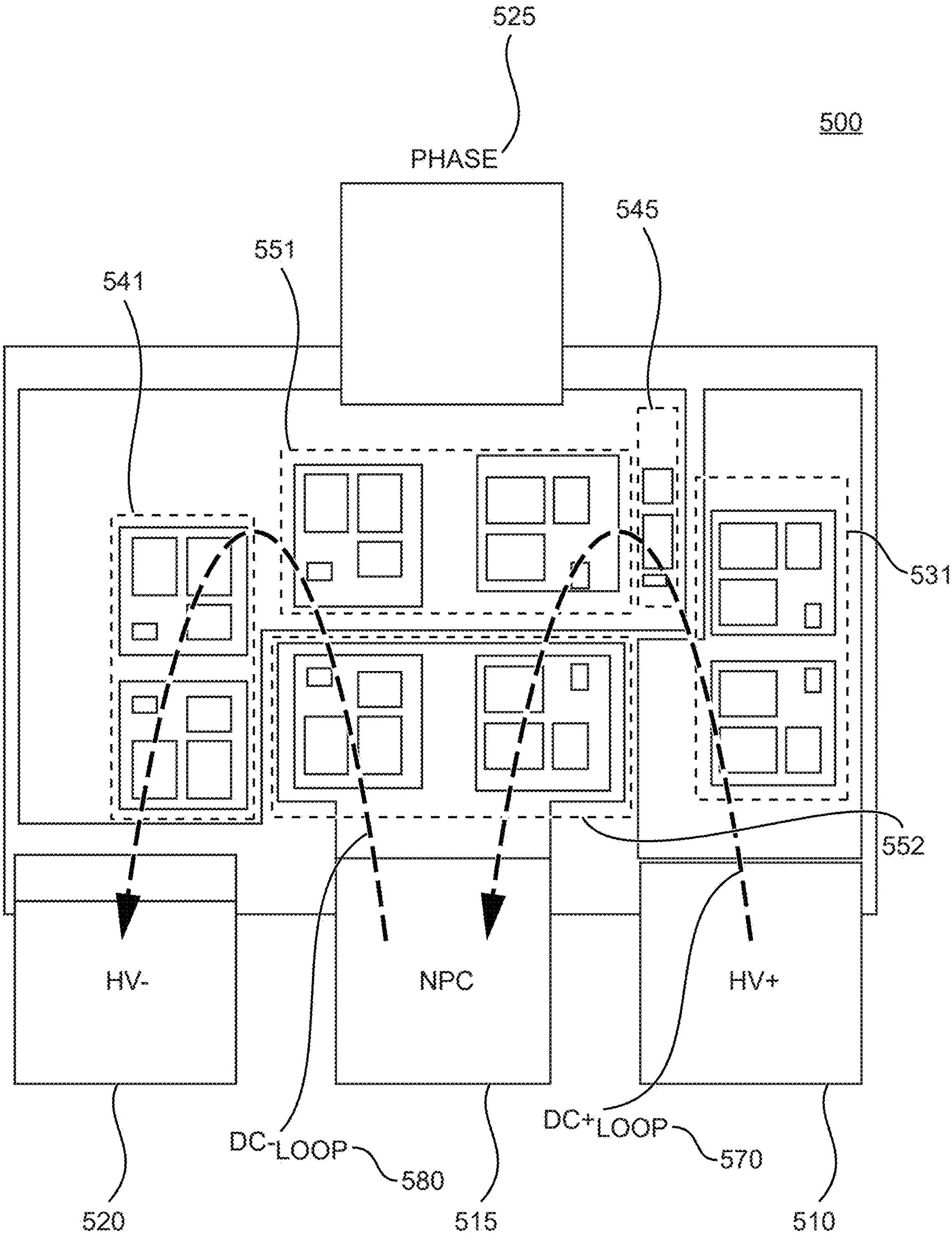
FIG. 5 depicts a power module with two-die switches in a drain-down configuration, according to one or more embodiments.

FIG. 5 depicts a power module with two-die switches in a drain-down configuration, according to one or more embodiments. Power module 500 may include a first switch 531, a second switch 541, a third switch 551, a fourth switch 552, a positive DC power tab 510, a negative DC power tab 520, a neutral power tab 515, and an AC power tab 525. The first switch 531 may be electrically connected to the positive DC power tab 510 and the AC power tab 525. The second switch 541 may be electrically connected to the negative DC power tab 520 and the AC power tab 525. The third switch 551 may be electrically connected to the fourth switch 552 and the AC power tab 525. The fourth switch 552 may be electrically connected to the neutral power tab 515 and the third switch 551.

With reference to FIG. 4, the first switch 431 may correlate with the first switch 531, the second switch 441 may correlate with the second switch 541, the third switch 451 may correlate with the third switch 551, the fourth switch 452 may correlate with the fourth switch 552, the positive DC power terminal 410 may correlate with the positive DC power tab 510, the negative DC power terminal 420 may correlate with the negative DC power tab 520, the neutral power terminal 415 may correlate with the neutral power tab 515, and the phase terminal 425 may correlate with the AC power tab 525. For brevity, the electrical power schematic of the power module 400 (e.g., see FIG. 4) and electrical connections (not shown in FIG. 5) of the power module 500 may contain many similarities which will not be discussed.

The first switch 531, the second switch 541, the third switch 551, and the fourth switch 552 may each include one or more semiconductor dies. For example, the first switch 531, the second switch 541, the third switch 551, and the fourth switch 552 may each include two semiconductor dies, but embodiments are not limited thereto. Each semiconductor die may include one or more transistors. Each transistor may include a source, a drain, and a gate.

The power module 500 may include one or more control pins (not shown in FIG. 5) electrically connected to semiconductor dies in each of the first switch 531, the second switch 541, the third switch 551, and the fourth switch 552. For example, the one or more control pins may be electrically connected to gates of one or more transistors in each semiconductor die in the first switch 531, the second switch 541, the third switch 551, and the fourth switch 552.

The semiconductor dies in the first switch 531 may be arranged in a symmetrical gate routing arrangement. For example, the gates of the one or more transistors in each semiconductor die in the first switch 531 may be electrically connected to a first control pin of the one or more control pins such that the gates of the one or more transistors in each semiconductor die in the first switch 531 may receive control signals simultaneously, at a same time (or substantially at a same time), from the first control pin. A symmetrical gate routing arrangement may include routing a gate control signal in a separate metal layer, for example.

The semiconductor dies in the second switch 541 may be arranged in a symmetrical gate routing arrangement. For example, the gates of the one or more transistors in each semiconductor die in the second switch 541 may be electrically connected to a second control pin of the one or more control pins such that the gates of the one or more transistors in each semiconductor die in the second switch 541 may receive control signals simultaneously, at a same time (or substantially at a same time), from the second control pin, but embodiments are limited thereto. For example, the gates of the one or more transistors in each semiconductor die in the second switch 541 may be electrically connected to the first control pin.

The semiconductor dies in the third switch 551 may be arranged in a symmetrical gate routing arrangement. For example, the gates of the one or more transistors in each semiconductor die in the third switch 551 may be electrically connected to a third control pin of the one or more control pins such that the gates of the one or more transistors in each semiconductor die in the third switch 551 may receive control signals simultaneously, at a same time (or substantially at a same time), from the third control pin, but embodiments are not limited thereto. For example, the gates of the one or more transistors in each semiconductor die in the third switch 551 may be electrically connected to the first control pin or the second control pin.

The semiconductor dies in the fourth switch 552 may be arranged in a symmetrical gate routing arrangement. For example, the gates of the one or more transistors in each semiconductor die in the fourth switch 552 may be electrically connected to a fourth control pin of the one or more control pins such that the gates of the one or more transistors in each semiconductor die in the fourth switch 552 may receive control signals simultaneously, at a same time (or substantially at a same time), from the fourth control pin, but embodiments are not limited thereto. For example, the gates of the one or more transistors in each semiconductor die in the fourth switch 552 may be electrically connected to the first control pin, the second control pin, or the third control pin.

The first switch 531, the second switch 541, the third switch 551 and the fourth switch 552 may include semiconductor dies arranged in a drain-down arrangement. For example, drains in the transistors in each semiconductor die in the first switch 531, the second switch 541, the third switch 551 and the fourth switch 552 may physically have the drains facing to a same direction.

The power module 500 may include one or more spacers 545 arranged between layers of drains, gates, and/or sources of the semiconductor dies in one or more of the first switch 531, the second switch 541, the third switch 551, and the fourth switch 552. The one or more spacers 545 may include a conductive material.

The power module 500 may have a symmetrical arrangement with respect to the first switch 531, the second switch 541, the third switch 551, the fourth switch 552, the positive DC power tab 510, the negative DC power tab 520, the neutral power tab 515, and the AC power tab 525. For example, a first power loop 570 between the positive DC power tab 510 and the neutral power tab 515 may be symmetrical with respect to a second power loop 580 between the negative DC power tab 520 and the neutral power tab 515.

A DC loop inductance measured in the first power loop 570 may be approximately 12.9 nH and a DC loop inductance measured in the second power loop 580 may be approximately 12.9 nH. A 1 MHz loop inductance measured in the first power loop 570 may be approximately 6.1 nH and a 1 MHz loop inductance measured in the second power loop 580 may be approximately 6.1 nH. However, this is an example, and embodiments are not limited thereto.

Figure 6:
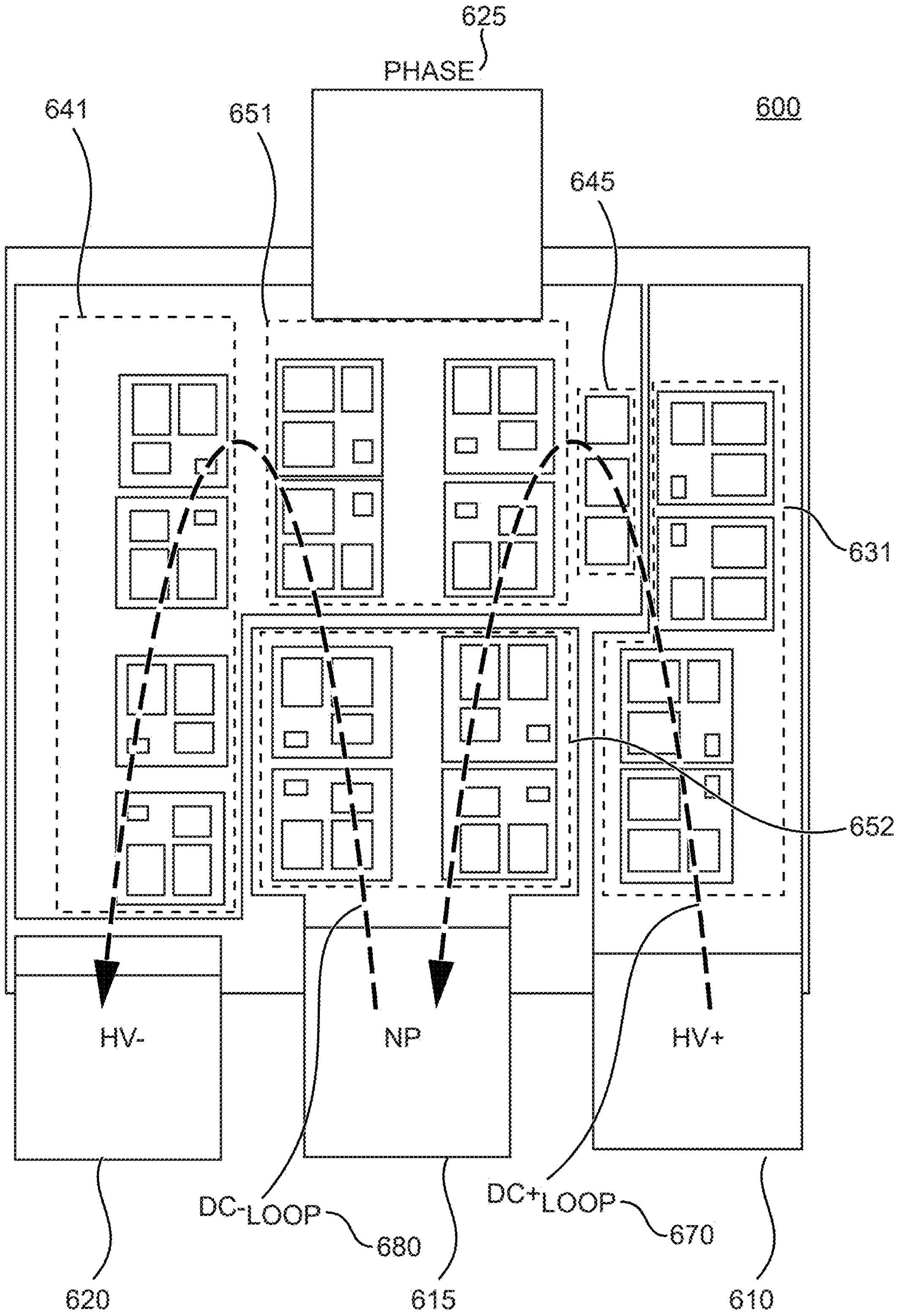
FIG. 6 depicts a power module with four-die switches in a drain-down configuration, according to one or more embodiments.

FIG. 6 depicts a power module with four-die switches in a drain-down configuration, according to one or more embodiments. Power module 600 may include a first switch 631, a second switch 641, a third switch 651, a fourth switch 652, a positive DC power tab 610, a negative DC power tab 620, a neutral power tab 615, and an AC power tap 625. For brevity, power module 600 and power module 500 (e.g., see FIG. 5) may contain many similarities which will not be discussed. For brevity of description, only distinctions between the power module 500 and the power module 600 will be described.

The first switch 631, the second switch 641, the third switch 651, and the fourth switch 652 may each include one or more semiconductor dies. For example, the first switch 631, the second switch 641, the third switch 651, and the fourth switch 652 may each include four semiconductor dies, but embodiments are not limited thereto. Each semiconductor die may include one or more transistors. Each transistor may include a source, a drain, and a gate.

The power module 600 may include one or more spacers 645 arranged between layers of drains, gates, and/or sources of the semiconductor dies in one or more of the first switch 631, the second switch 641, the third switch 651, and the fourth switch 652. The one or more spacers 645 may include a conductive material.

A DC loop inductance measured in the first power loop 670 may be approximately 17.3 nH and a DC loop inductance measured in the second power loop 680 may be approximately 16.3 nH. A 1 MHz loop inductance measured in the first power loop 670 may be approximately 5.1 nH and a 1 MHz loop inductance measured in the second power loop 680 may be approximately 5.0 nH. However, embodiments are not limited thereto. For example, the first power loop 670 and the second power loop 680 may be arranged to have symmetric loop inductance and/or may have the same inductance.

Figure 7:
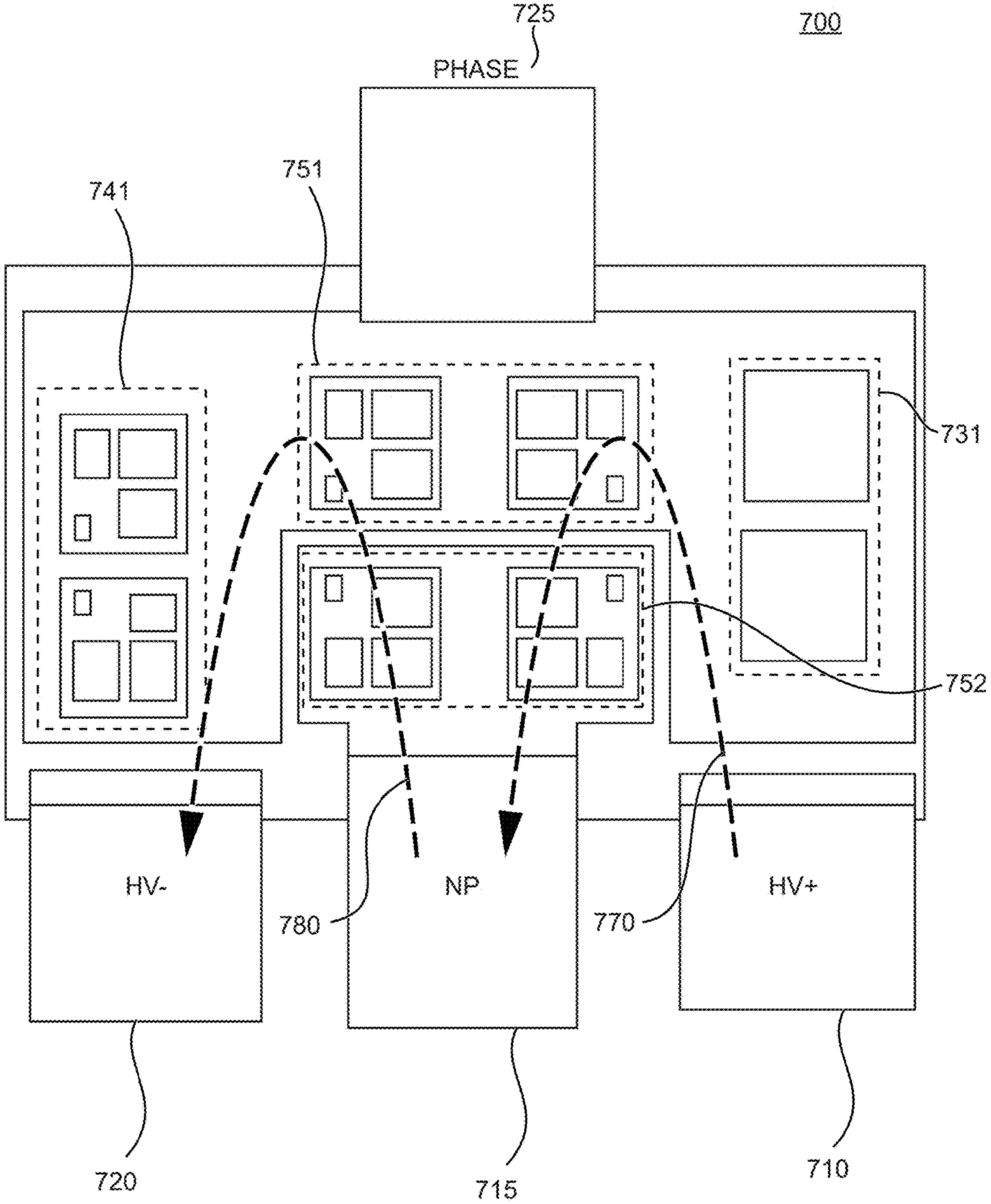
FIG. 7 depicts a power module with two-die switches in a drain-down and source-down configuration, according to one or more embodiments.

FIG. 7 depicts a power module with two-die switches in a drain-down and source-down configuration, according to one or more embodiments. Power module 700 may include a first switch 731, a second switch 741, a third switch 751, a fourth switch 752, a positive DC power tab 710, a negative DC power tab 720, a neutral power tab 715, and an AC power tap 725. For brevity, power module 700 and power module 500 (e.g., see FIG. 5) may contain many similarities which will not be discussed. For brevity of description, only distinctions between the power module 500 and the power module 700 will be described.

The first switch 731, the second switch 741, the third switch 751, and the fourth switch 752 may each include two semiconductor dies arranged in a drain-down and source-down arrangement. For example, transistors in semiconductor dies in the second switch 741, the third switch 751, and the fourth switch 752 may physically have drains facing to a first direction, and transistors in semiconductor dies in the first switch 731 may physically have sources facing to the first direction, but embodiments are not limited thereto. The transistors in the semiconductor dies in the second switch 741, the third switch 751, and the fourth switch 752 may physically have sources facing to a second direction, and the transistors in semiconductor dies in the first switch 731 may physically have drains facing the second direction, but embodiments are not limited thereto. The first direction may be opposite to the second direction. Power module 700 may not include spacers (e.g. one or more spacers 545), but embodiments are not limited thereto.

A DC loop inductance measured in the first power loop 770 may be approximately 13.0 nH and a DC loop inductance measured in the second power loop 780 may be approximately 13.0 nH. A 1 MHz loop inductance measured in the first power loop 770 may be approximately 6.2 nH and a 1 MHz loop inductance measured in the second power loop 780 may be approximately 6.2 nH.

Figure 8:
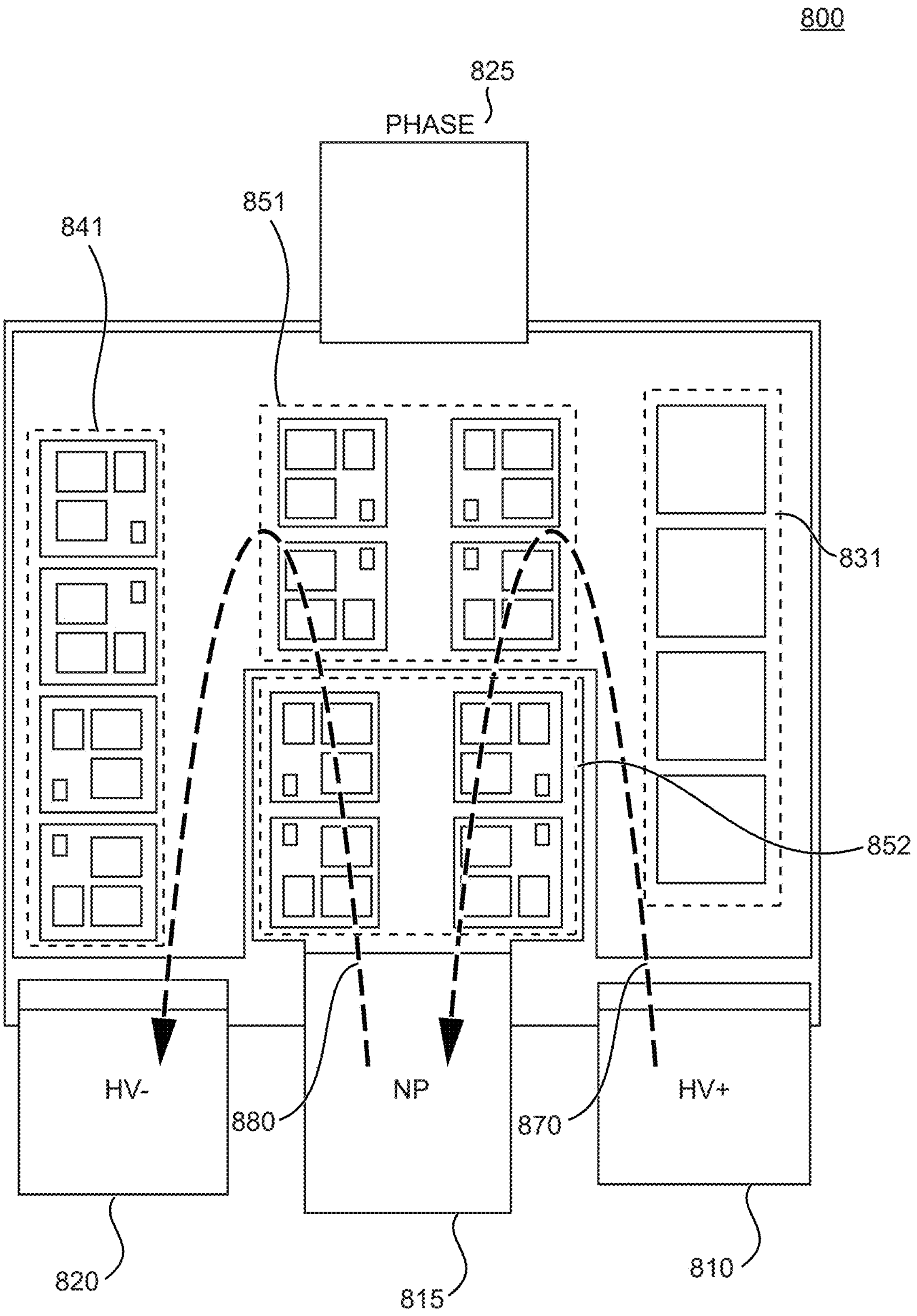
FIG. 8 depicts a power module with four-die switches in a drain-down and source-down configuration, according to one or more embodiments.

FIG. 8 depicts a power module with four-die switches in a drain-down and source-down configuration, according to one or more embodiments. Power module 800 may include a first switch 831, a second switch 841, a third switch 851, a fourth switch 852, a positive DC power tab 810, a negative DC power tab 820, a neutral power tab 815, and an AC power tap 825. For brevity, power module 800 and power module 600 (e.g., see FIG. 6) may contain many similarities which will not be discussed. For brevity of description, only distinctions between the power module 600 and the power module 800 will be described.

The first switch 831, the second switch 841, the third switch 851 and the fourth switch 852 may each include four semiconductor dies arranged in a drain and source-down arrangement. For example, transistors in semiconductor dies in the second switch 841, the third switch 851, and the fourth switch 852 may physically have the drains facing to a first direction, and transistors in semiconductor dies in the first switch 831 may physically have sources facing to the first direction, but embodiments are not limited thereto. Transistors in the semiconductor dies in the second switch 841, the third switch 851, and the fourth switch 852 may physically have sources facing to a second direction, and transistors in the semiconductor dies in the first switch 831 may physically have drains facing the second direction, but embodiments are not limited thereto. The first direction may be opposite to the second direction. Power module 800 may not include spacers (e.g., one or more spacers 645), but embodiments are not limited thereto.

A DC loop inductance measured in the first power loop 870 may be approximately 16.1 nH and a DC loop inductance measured in the second power loop 880 may be approximately 16.4 nH. A 1 MHz loop inductance measured in the first power loop 870 may be approximately 5.2 nH and a 1 MHz loop inductance measured in the second power loop 880 may be approximately 5.2 nH.

Figure 9:
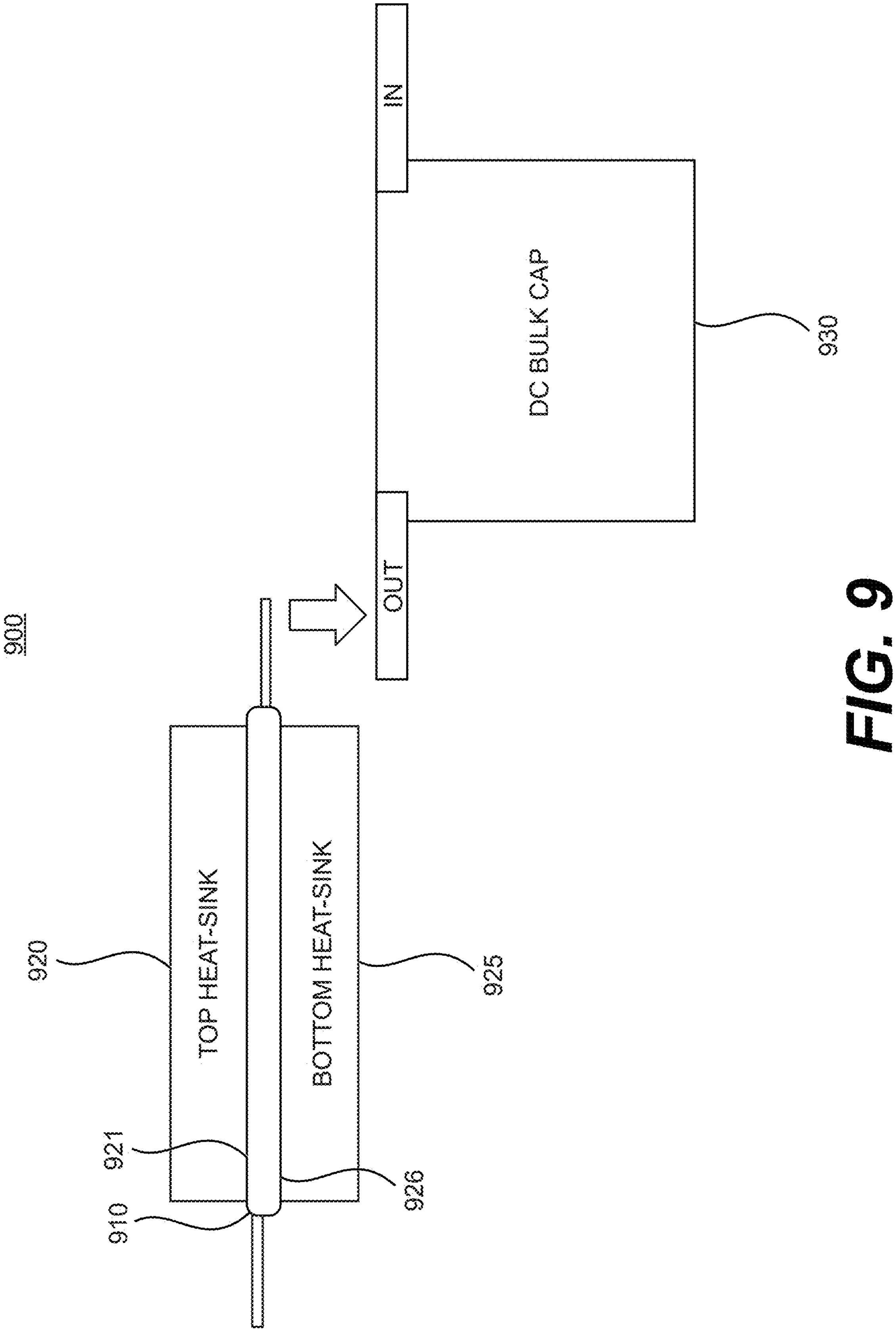
FIG. 9 depicts a power module with heat sinks and a bulk capacitor, according to one or more embodiments.

FIG. 9 depicts a side view of a power module, according to one or more embodiments. Power module arrangement 900 includes a side view of a power module 910 and a bulk capacitor 930. The power module 910 in FIG. 9 may include one or more of the power module 500, the power module 600, the power module 700, or the power module 800. For example, the power module 910 may include three power modules (not shown in FIG. 9) for a three phase system. For example, with reference to FIG. 2, the power module 910 may include a first power module corresponding to ϕA, a second power module corresponding to ϕB, and a third power module corresponding to ϕC.

Power module arrangement 900 may include one or more heat sinks on the power module 910. The one or more heat sinks may include a first heat sink 920 and a second heat sink 925. The first heat sink 920 may be provided on the power module 910 such that the first heat sink 920 is provided on (e.g., or directly on, or in contact with) a first side surface 921 of the power module 910. The second heat sink 925 may be provided on the power module 910 such that the second heat sink 925 is provided on (e.g., or directly on, or in contact with) a second side surface 926 of the power module 910. The first side surface 921 of the power module 910 may be a top side surface and the second side surface 926 of the power module 910 may be a bottom side surface.

The first heat sink 920 and the second heat sink 925 may be provided on a combination of one or more power modules. For example, the first heat sink 920 may be provided on a power module assembly including a combination of two or more of any one of the power module 500, the power module 600, the power module 700, and/or the power module 800, such that the first heat sink 920 may be provided on (e.g., or directly on, or in contact with) first side surfaces (e.g., top side surfaces) of the two or more of the power module 500, the power module 600, the power module 700, and/or the power module 800.

The first heat sink 920 and the second heat sink 925 may be provided on a combination of one or more power modules. For example, the second heat sink 925 may be provided on a power module assembly including a combination of two or more of any one of the power module 500, the power module 600, the power module 700, and/or the power module 800, such that the second heat sink 925 may be provided on (e.g., or directly on, or in contact with) second side surfaces (e.g., bottom side surfaces) of the two or more of the power module 500, the power module 600, the power module 700, and/or the power module 800.

Power module 910 may be electrically connected to a bulk capacitor 930. The bulk capacitor 930 may be arranged in a top-down mounting arrangement such that the power module 910 is arranged on a top side surface of the bulk capacitor, but embodiments are not limited thereto.

According to one or more embodiments, inverters including power modules with switches having a T-type arrangement may have a reduction of the parasitic inductance, which may enable higher switching speeds when a complete commutation loop is used in combination with a bulk capacitor having a similarly low parasitic inductance. According to one or more embodiments, reduced parasitic inductances may electromagnetic compatibility (EMC) compliance with minimal or reduced efforts. According to one or more embodiments, inverters including power modules with switches having a T-type arrangement may be beneficial in that such inverters may have a reduced number of power switches per module. According to one or more embodiments, inverters including power modules having a T-type arrangement may be double-side cooled, which may be beneficial for operation and reliability of power modules.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:

an inverter to convert DC power from a battery to AC power to drive a motor, wherein the inverter includes:

a first power module including:

a first switch electrically connected to a positive DC power tab and an AC power tab;

a second switch electrically connected to a negative DC power tab and the AC power tab; and a third switch and a fourth switch arranged in series and electrically connected to a neutral power tab and the AC power tab, wherein the first switch, the second switch, the third switch, and the fourth switch each include two or more semiconductor dies, and wherein each of the two or more semiconductor dies in the first switch, the second switch, the third switch, and the fourth switch are arranged with symmetrical gate routing.

2. The system of claim 1, further comprising:

a first heat sink on a first side of the first power module; and a second heat sink on a second side of the first power module.

3. The system of claim 1, further including a capacitor electrically connected to the first power module.

4. The system of claim 1, further comprising:

a second power module; and a third power module, wherein the first power module corresponds to a first phase of the motor, the second power module corresponds to a second phase of the motor, and the third power module corresponds to a third phase of the motor.

5. The system of claim 4, further comprising:

a first heat sink; and a second heat sink, wherein the first heat sink is on a first side surface of the first power module, on a first side surface of the second power module, and on a first side surface of the third power module, and wherein the second heat sink is on a second side surface of the first power module, on a second side surface of the second power module, and on a second side surface of the third power module.

6. The system of claim 1, wherein the two or more semiconductor dies in the first switch, the second switch, the third switch, and the fourth switch are arranged in a drain-down arrangement.

7. The system of claim 1, wherein the third switch and the fourth switch are a switch group.

8. The system of claim 1, wherein:

the two or more semiconductor dies in the second switch, the third switch, and the fourth switch are arranged in a drain-down arrangement, and the two or more semiconductor dies in the first switch are arranged in a source-down arrangement.

9. The system of claim 1, further including:

the battery configured to supply the DC power to the inverter; and the motor configured to receive the AC power from the inverter to drive the motor, wherein the system is provided as a vehicle including the inverter, the battery, and the motor.

10. A system including a power module for an inverter, the power module including:

a first switch electrically connected to a positive DC power tab and an AC power tab;

a second switch electrically connected to a negative DC power tab and the AC power tab; and a third switch and a fourth switch arranged in series and electrically connected to a neutral power tab and the AC power tab, wherein the first switch, the second switch, the third switch, and the fourth switch each include two or more semiconductor dies, and wherein each of the two or more semiconductor dies in the first switch, the second switch, the third switch, and the fourth switch are arranged with symmetrical gate routing.

11. The system of claim 10, wherein the two or more semiconductor dies in the first switch, the second switch, the third switch, and the fourth switch are arranged in a drain-down arrangement.

12. The system of claim 10, wherein the power module includes one or more spacers.

13. The system of claim 10, wherein:

the two or more semiconductor dies in the second switch, the third switch, and the fourth switch are arranged in a drain-down arrangement, and the two or more semiconductor dies in the first switch are arranged in a source-down arrangement.

14. The system of claim 10, further including a capacitor electrically connected to the power module.

15. A system including a power module, the power module comprising:

a positive DC power tab;

a negative DC power tab;

a neutral power tab;

an AC power tab;

a first switch electrically connected to the positive DC power tab and the AC power tab;

a second switch electrically connected to the negative DC power tab and the AC power tab; and a third switch and a fourth switch arranged in series and electrically connected to the neutral power tab and the AC power tab, wherein the first switch, the second switch, the third switch, and the fourth switch each include two or more semiconductor dies, and wherein each of the two or more semiconductor dies in the first switch, the second switch, the third switch, and the fourth switch are arranged with symmetrical gate routing.

16. The system of claim 15, further including: a first heat sink; and a second heat sink, wherein the first heat sink is on a first surface of the power module, and wherein the second heat sink is on a second surface of the power module.

* * * * *